(12) United States Patent
Ku et al.

(10) Patent No.: US 8,699,021 B2
(45) Date of Patent: Apr. 15, 2014

(54) SYSTEM, METHOD AND COMPUTER READABLE MEDIUM FOR THROUGH SILICON VIA STRUCTURE MEASUREMENT

(75) Inventors: Yi Sha Ku, Hsinchu (TW); Wei Te Hsu, Banqiao (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 448 days.

(21) Appl. No.: 13/105,493

(22) Filed: May 11, 2011

(65) Prior Publication Data
US 2012/0197592 A1 Aug. 2, 2012

(30) Foreign Application Priority Data

Jan. 31, 2011 (TW) .............................. 100103565 A

(51) Int. Cl.
*G01B 11/28* (2006.01)
*G01J 3/00* (2006.01)

(52) U.S. Cl.
USPC ............................ 356/303; 356/630; 356/328

(58) Field of Classification Search
USPC .......................................... 356/630, 303, 328
See application file for complete search history.

(56) References Cited

U.S. PATENT DOCUMENTS

| 6,046,808 | A  | * | 4/2000 | Fateley ........................ 356/330 |
| 6,226,086 | B1 |   | 5/2001 | Holbrook et al. |
| 6,271,047 | B1 | * | 8/2001 | Ushio et al. ..................... 438/14 |
| 7,019,844 | B2 |   | 3/2006 | Venugopal et al. |
| 7,738,113 | B1 |   | 6/2010 | Marx et al. |
| 7,782,468 | B2 |   | 8/2010 | Courteville |
| 2003/0165755 | A1 |  | 9/2003 | Mui et al. |
| 2009/0135416 | A1 | * | 5/2009 | Shchegrov et al. ........... 356/300 |

\* cited by examiner

*Primary Examiner* — Michael A Lyons
*Assistant Examiner* — Rebecca C Bryant
(74) *Attorney, Agent, or Firm* — Egbert Law Offices, PLLC

(57) ABSTRACT

A system for through silicon via (TSV) structure measurement comprises a reflectometer, and a computing unit. The reflectometer emits a broadband light beam to at least a TSV structure and receives a reflection spectrum of at least a TSV structure. The computing unit is coupled with the reflectometer and determines the depth of the TSV structure in accordance with the reflection spectrum.

17 Claims, 15 Drawing Sheets

SYSTEM, METHOD AND COMPUTER READABLE MEDIUM FOR THROUGH SILICON VIA STRUCTURE MEASUREMENT

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The disclosure relates to a system, a method and a computer readable medium for semiconductor structure measurement, and particularly, to a system, method and a computer readable medium for through silicon via structure measurement.

2. Description of Related Art Including Information Disclosed Under 37 CFR 1.97 and 37 CFR 1.98

As consumer demand for lighter and smaller electronic devices continues to grow, semiconductor manufacturing techniques are advancing to meet such requirements. In particular, a new technique, known as the 3D stacking technique, has been developed. The 3D stacking technique utilizes through silicon via (TSV) technique, which involves vertically stacking a plurality of chips, to reduce the overall package size. TSV technique uses a via structure to vertically connect a plurality of chips, and therefore can replace wire bonding technique to save the costs of routing and intermediate layers required by wire bonding technique.

Due to the aforementioned advantages, TSV technique is popular among small-sized electronic devices with high aspect ratio. Accordingly, measurement of the via structures formed according to TSV technique has become an issue of importance. Generally, large sized via structures, e.g. via structure with aperture greater than 10 micrometers, can be measured by laser microscope. However, for via structures with high density, e.g. via structures with via space ratio greater than 1, via structures with high aspect ratio, e.g. via structures with aspect ratio greater than 10, or via structures with small aperture, e.g. via structures with aperture smaller than 10 micrometers, most of the current measuring methods, such as measuring methods utilizing laser microscopes or infrared interferometers, are too slow to measure multiple via structures or chips with thin oxide layers. In other words, the parameters, especially the depth, of via structures with high density, high aspect ratio or small aperture cannot currently be measured in an optical and non-destructive way.

On the other hand, TSV technique is progressing toward high-density and high aspect-ratio applications. According to the International Technology Roadmap for Semiconductor (ITRS) published in 2008, the aperture of all TSVs on the market were estimated to be smaller than 1.4 micrometer, and the aspect ratios of all TSVs on the market were estimated to be greater than 10.

Accordingly, there is a need to design a system and a method for through silicon via structure measurement in which the depths of multiple through silicon via structures can be measured in a non-destructive way.

BRIEF SUMMARY OF THE INVENTION

The present disclosure provides a system and a method for measurement of through silicon via structure. The system and the method utilize Fourier transformation to decompose a refection spectrum so as to determine the depth of at least one via structure. Thus, the system and the method are capable of immediately obtaining depth parameter in a non-destructive way for measurement of through silicon via structure. Therefore, the system and the method can immediately determine whether a substrate with high density through silicon via structures is defective or not.

The present disclosure provides a method for measurement of a substrate covered by an oxide layer, wherein the substrate includes high density through silicon via structures. The method comprises the following steps: obtaining a reflection spectrum of at least one through silicon via structure; carrying out a calculation based upon frequency data contained in the reflection spectrum; and determining at least one depth of at least one of the through silicon via structures according to the calculation.

The present disclosure provides a non-destructive detecting method of measurement of a substrate having high-density through silicon via structures. The method includes the following steps: obtaining a reflection spectrum of at least two of the through silicon via structures; carrying out a calculation based upon frequency data contained in the reflection spectrum; determining at least two depths of the through silicon via structures according to the calculation; determining whether the difference between the depths of the through silicon via structures is greater than a predetermined threshold; and if the difference in depths is greater than the predetermined threshold, the substrate containing the through silicon via structures is defective.

The present disclosure provides a system for measurement of a through silicon via structure comprising a reflectometer and a computing unit. The reflectometer emits a wideband beam to at least one of the through silicon via structures and obtains a reflection spectrum of at least one of the through silicon via structures. The computing unit is electrically coupled with the reflectometer and carries out a calculation based upon the reflection spectrum to determine at least a depth of at least one of the through silicon via structures according to the calculation of the reflection spectrum.

The present disclosure provides a computer readable medium for storing an application program. The application program allows a system for measurement of a through silicon via structure to perform a detecting method. The detecting method comprises the following steps: obtaining a reflection spectrum of at least two of the through silicon via structures; carrying out a calculation based upon frequency data contained in the reflection spectrum; determining at least two depths of the through silicon via structures according to the calculation; determining whether the difference between the depths of the through silicon via structures is greater than a predetermined threshold; and if the difference in depths is greater than the predetermined threshold, a substrate containing the through silicon via structures is defective.

The foregoing has outlined rather broadly the features and technical benefits of the disclosure in order that the detailed description of the disclosure that follows may be better understood. Additional features and benefits of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the disclosure. It should also be realized by those skilled in the art that such equivalent constructions do not depart from the spirit and scope of the disclosure as set forth in the appended claims.

BRIEF DESCRIPTION OF THE SEVERAL VIEWS OF THE DRAWINGS

The accompanying drawings, which are incorporated in and constitute a part of this specification, illustrate embodiments of the disclosure and, together with the description, serve to explain the principles of the disclosure.

DETAILED DESCRIPTION OF THE INVENTION

The present disclosure provides the following systems, methods, and computer readable mediums for measurement of through silicon via structures. In order to completely realize the present disclosure, the following description will provide complete steps and components. Clearly, the practice of the present disclosure is not limited to particular embodiments anticipated by persons skilled in the art. On the other hand, the common components and procedures are not disclosed in the detailed description to prevent unnecessary limitation of the present disclosure. Some embodiments of the present disclosure will be described as follows. However, in addition to these detail descriptions, the present disclosure can be widely applied for other embodiments, which do not limit the patent scope of the present disclosure. The patent scope should be based on the foregoing claims.

References to "one embodiment," "various embodiments," "other embodiments," "exemplary embodiment," etc., indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may. Unless specifically stated otherwise, as apparent from the following discussions utilizing terms such as "separating," "calculating," "computing," "performing," "judging," "transforming," "determining," or the like, refer to the action and/or processes of a computer or computing system, or similar electronic computing device, state machine and the like that manipulate and/or transform data represented as physical, such as electronic, quantities into other data similarly represented as physical quantities.

The following systems, methods, and computer readable mediums for measurement of through silicon via structures are based on thin film theory. Specifically, the exemplary embodiments of the present disclosure utilize a reflectometer to emit and collect the reflection spectrums of the through silicon via structures. In addition, the other exemplary embodiments of the disclosure simulate the reflection spectrums of the through silicon via structures based upon the Fresnel equation, and then determine the via structure parameters by comparing the collected reflection spectrums and the simulated reflection spectrums. Furthermore, the exemplary embodiments of the disclosure use an ellipsoid model to simulate the bottom profile of the through silicon via structures, generate the simulated reflection spectrums accordingly, and then determine the bottom profile of the through silicon via structures by comparing the collected reflection spectrums and the simulated reflection spectrums.

Figure 1:
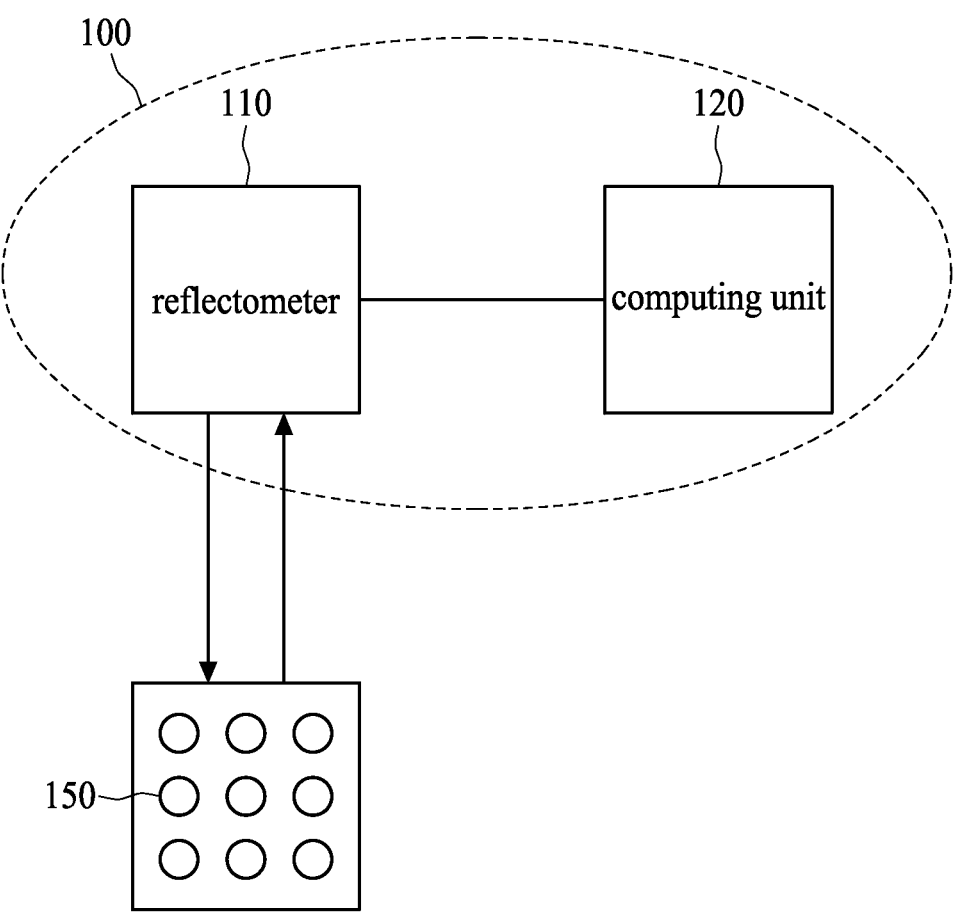
FIG. 1 illustrates a schematic view of a system for measurement of through silicon via structure in accordance with an exemplary embodiment of the present disclosure.
Figure 2:
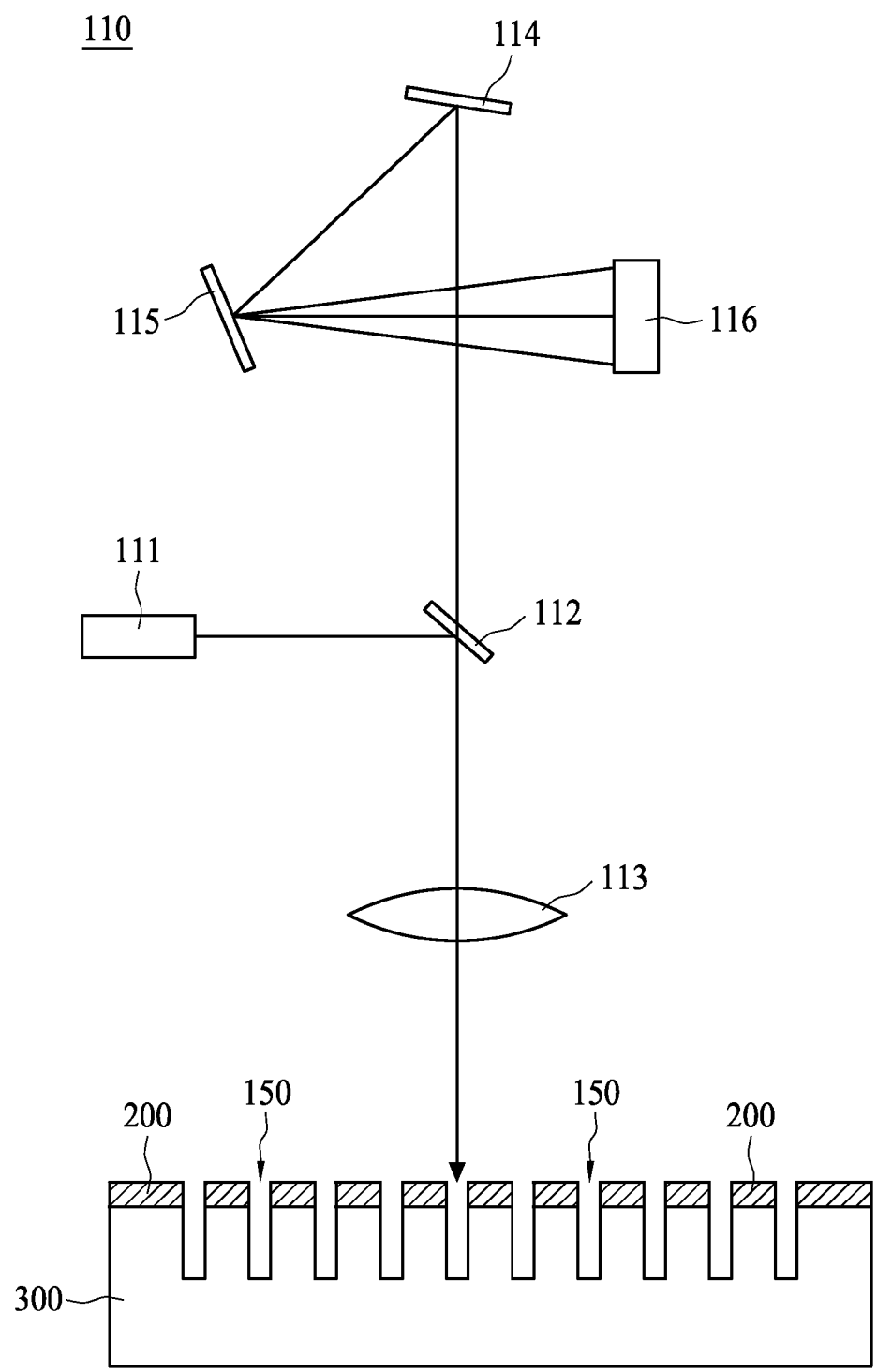
FIG. 2 shows a perspective view illustrating a reflectometer according to an exemplary embodiment of the present disclosure.

FIG. 1 illustrates a schematic view of a system 100 for measurement of through silicon via structures in accordance with an exemplary embodiment of the present disclosure. As shown in FIG. 1, the system 100 comprises a reflectometer 110 and a computing unit 120. The reflectometer 110 emits a wideband beam to at least one of the through silicon via structures 150 and collects a reflection spectrum of a through silicon via structure 150. As shown in FIG. 2, the reflectometer 110 includes a wideband light pump 111, a beam splitter 112, a convex lens 113, a reflection mirror 114, a grating 115, and a light sensor 116. The wideband light pump 111 (such as a wideband laser pump) emits the wideband beam to the beam splitter 112, which guides the wideband beam to pass through the convex lens and then focus on at least one through silicon via structures 150. The wideband beam is collimated into the bottom of the through silicon via structure 150 and then is reflected as a wideband reflection beam. Consequently, the wideband reflection beam passes through the convex lens 113 and the beam splitter 112 and is guided to the reflection mirror 114. The reflection mirror 114 reflects the wideband reflection beam to the grating 115 so as to split the wideband reflection beam and then generate a reflection spectrum. Since the light sensor 116 is disposed corresponding to the grating 115, the light sensor 116 can collect the reflection spectrum from the grating 115. In the embodiment, the light sensor 116 is selected from a group consisting of a charge-couple device (CCD) and a complementary metal-oxide semiconductor (CMOS) sensor. Moreover, in the embodiment, although the wideband beam is emitted on a single through silicon via structure 150, in another embodiment (not shown), the wideband beam is collimated into at least two through silicon via structures 150 simultaneously and then a reflection spectrum of at least two of the through silicon via structures 150 can be simultaneously generated for identifying the difference between the depths of two through silicon via structures 150. In another embodiment (not shown), the reflectometer 110 can be any reflectometer available on the market, such as those provided by Nanometrics or Nova.

In the embodiment shown in FIG. 1, the computing unit 120 is electrically coupled with the reflectometer 110 and performs Fourier transformation based on the reflection spectrum to determine at least one depth of at least one through silicon via structure 150. Particularly, the computing unit 120 can be a computer. The computing unit 120 performs Discrete Fourier transformation of the reflection spectrum to determine the depth of at least one of the through silicon via structures 150. In addition, the computing unit 120 can calculate the depths of at least two of the through silicon via structures and determine whether the difference between the depths of the two through silicon via structures 150 is greater than a predetermined threshold. If the difference between the depths of the two through silicon via structures 150 is greater than the predetermined threshold, the substrate having these through silicon via structures 150 is judged to be defective. In other embodiments (not shown), the computing unit 120 further includes a simulation unit (not shown) and a comparing unit (not shown). The simulation unit is configured to provide reflection spectrums of the through silicon via structure 150. The simulation unit can be a database, comprising a plurality of the reflection spectrums of through silicon via structures with different depths and different bottom profiles. The comparing unit is configured to determine the depth and bottom profile of the through silicon via structure 150 by comparing the reflection spectrums collected by the reflectometer 110 and the simulated reflection spectrums provided by the simulation unit. As shown in FIG. 1, the system 100 determines the structural parameters of the through silicon via structure 150 by analyzing the reflection spectrums. Accordingly, the destruction caused by conventional measuring methods does not occur.

Figure 3:
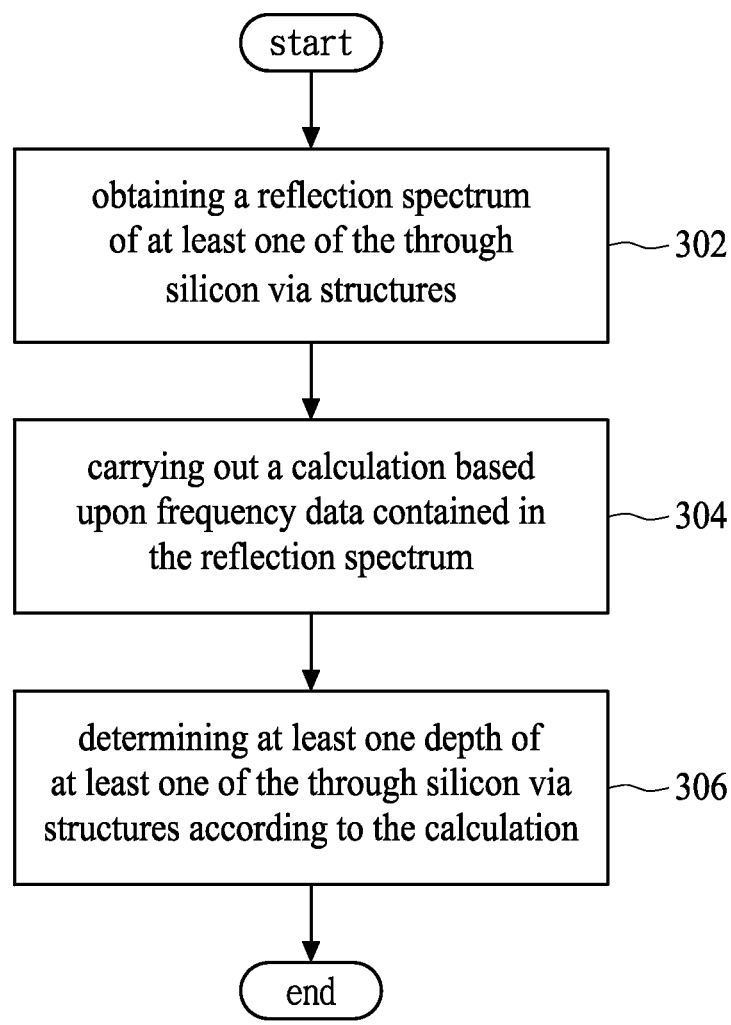
FIG. 3 shows a flow chart illustrating a method for measurement of a substrate covered by an oxide layer in accordance with an exemplary embodiment of the present disclosure.

FIG. 3 is a flow chart illustrating an exemplary embodiment of a method for measurement of a substrate 300 (shown in FIG. 2) covered by an oxide layer 200 (shown in FIG. 2). The substrate 300 includes a high-density through silicon via structure 150 (shown in FIG. 2). The method includes the following steps. Step 302 obtains a reflection spectrum of at least one through silicon via structures, and step 304 is executed. In step 304, a calculation is carried out based upon frequency data contained in the reflection spectrum, and step 306 is executed. In step 306, at least one depth of at least one of the through silicon via structures is determined according to the calculation of the frequency data of the reflection spectrum. In other embodiments (not shown), the method can determine the bottom profile of the through silicon via structure based upon the calculation of magnitude of the reflection spectrum. In the embodiment, the reflection spectrum includes a high-frequency portion and a low-frequency portion. The low-frequency portion serves as the carrier frequency of the high-frequency portion. Particularly, the calculation step 304 calculates according to the high-frequency portion of the reflection spectrum. The depth determining step 306 determines the depth of the through silicon via structure according to the calculation of the high-frequency portion of the reflection spectrum. In another embodiment (not shown), If the calculation step can calculate according to the low-frequency portion of the reflection spectrum, the depth determining step can determine the thickness of the oxide layer according to the calculation of the low-frequency portion of the reflection spectrum. In the above-mentioned embodiment shown in FIG. 3, the calculation step 304 further separates or mixes the high-frequency portion and the low-frequency portion. If the high-frequency portion is separated from the low-frequency portion, the high-frequency portion and the low-frequency portion can be calculated separately. In addition, the calculation step 304 also performs Discrete Fourier transformation of the reflection spectrums. The depth determining step 306 determines at least one depth of at least one of the through silicon via structures after Discrete Fourier transformation. Although the above-mentioned embodiment shown in FIG. 3 utilizes the reflectometer to emit on a single through silicon via structure and to collect the reflection spectrum, in another embodiment (not shown), the reflection spectrum can be collected by simultaneously emitting on a plurality of through silicon via structures. Moreover, the depth determining step 306 can determine the depths of these through silicon via structures simultaneously.

Figure 4:
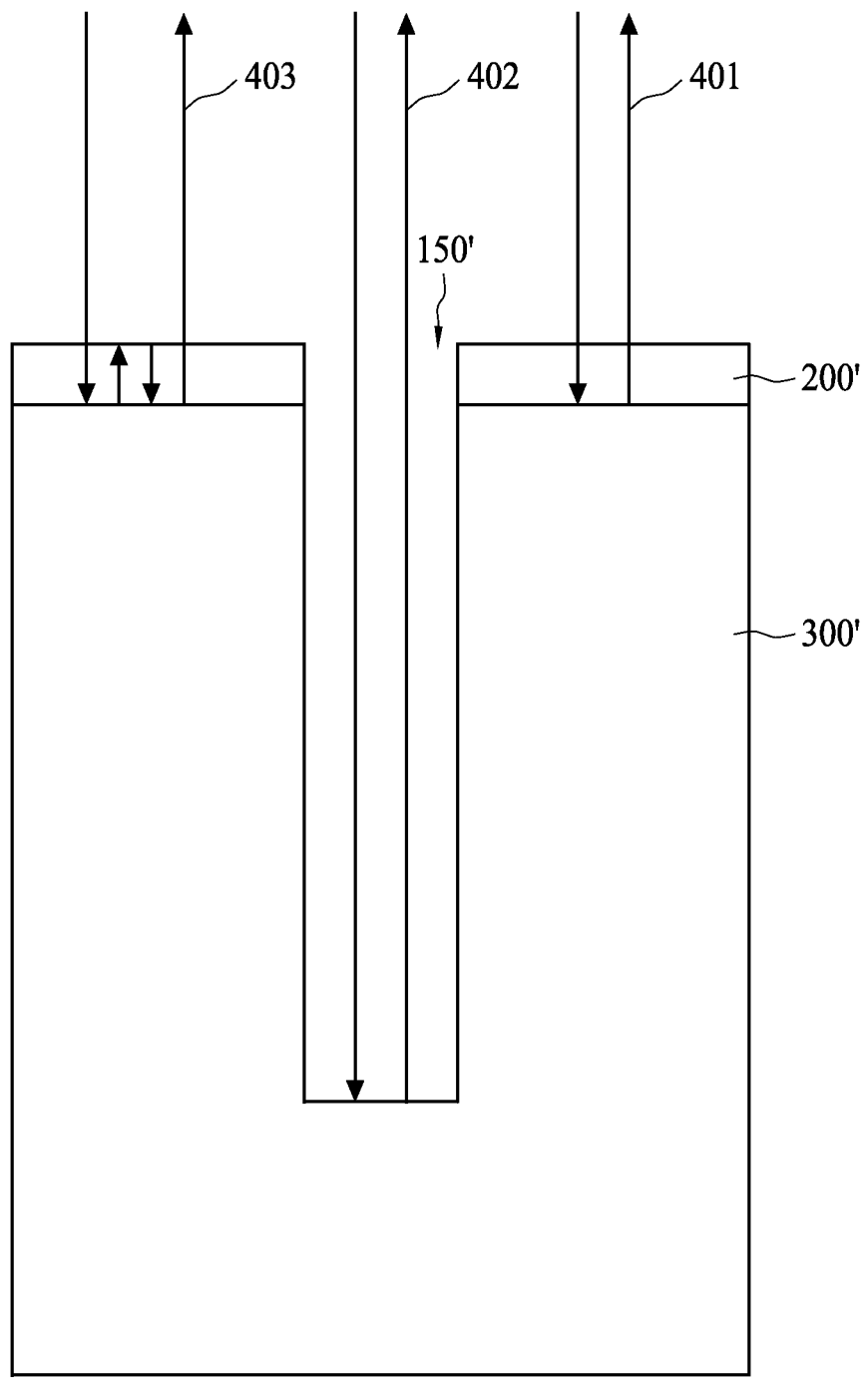
FIG. 4 shows a perspective view of a substrate covered by an oxide layer, the substrate having a high aspect ratio and small aperture in accordance with an exemplary embodiment of the present disclosure.
Figure 5:
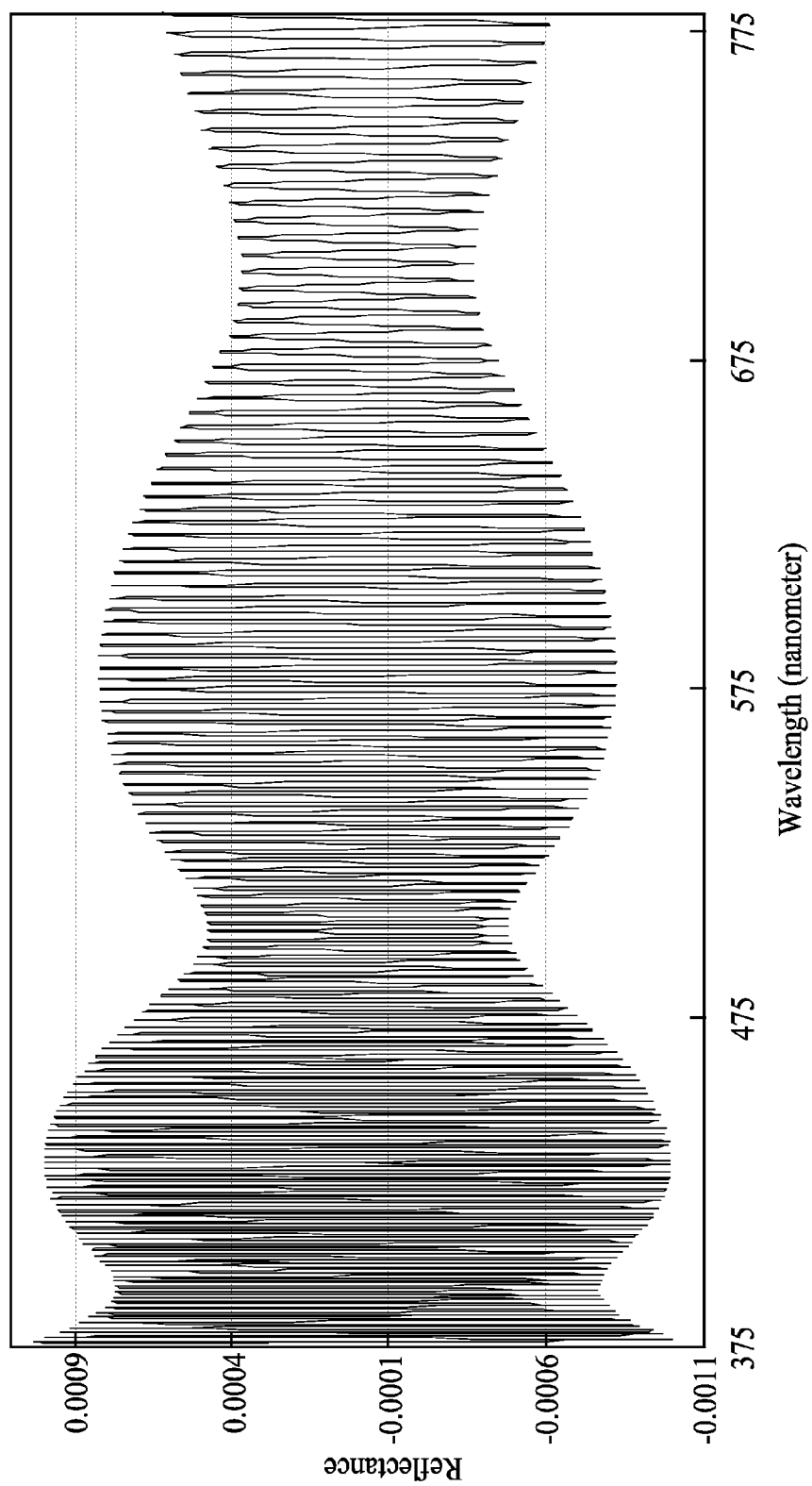
FIG. 5 shows a high-frequency portion of the reflection spectrum shown in FIG. 4.
Figure 6:
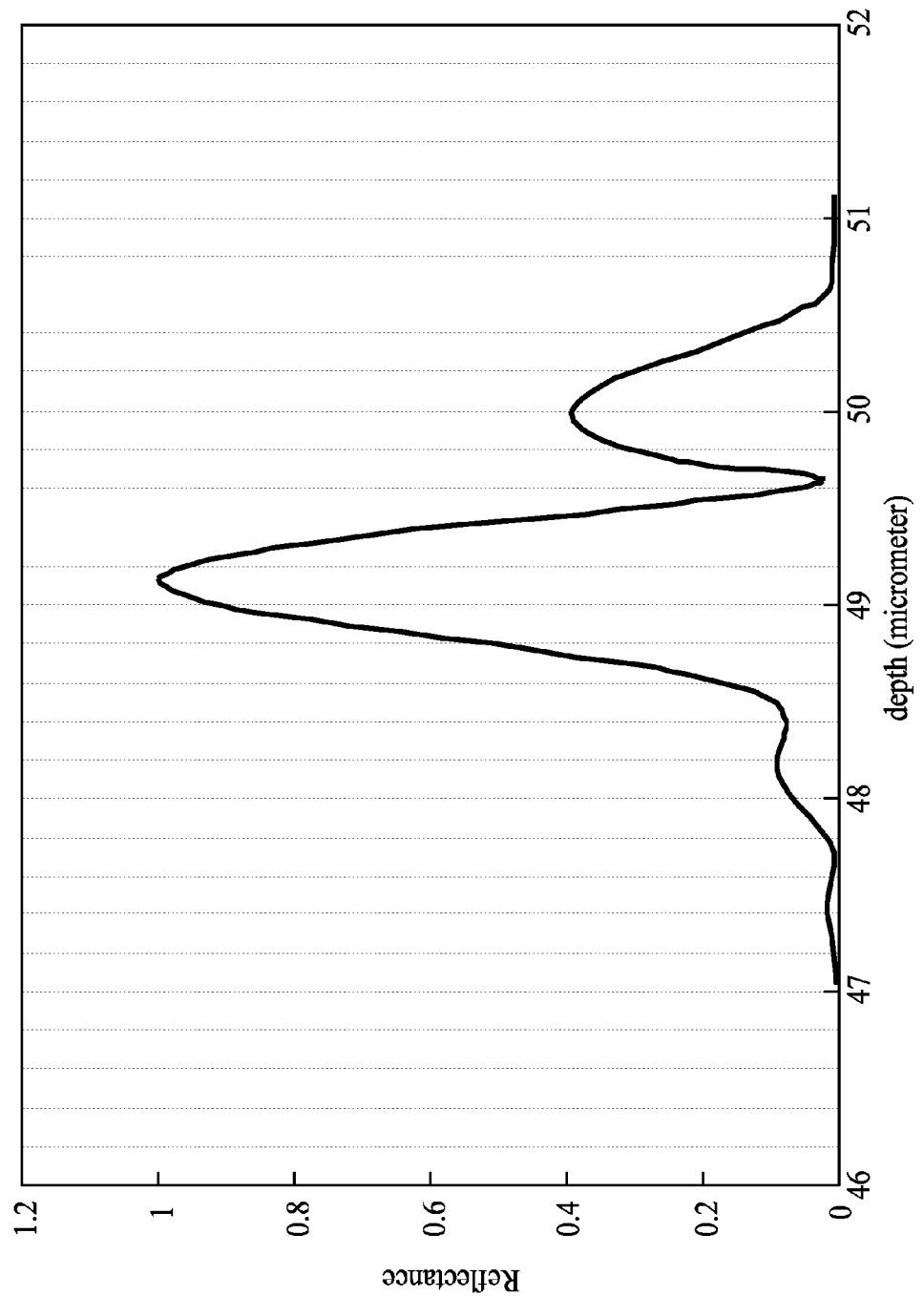
FIG. 6 shows a curve after Discrete Fourier transformation of the reflection spectrum based on FIG. 4.

FIG. 4 shows a substrate 300' covered by an oxide layer 200'. The substrate 300' includes a through silicon via structure 150' with small aperture and high aspect ratio. The system 100 shown in FIG. 1 and the method shown in FIG. 2 are applied to the through silicon structure 150' shown in FIG. 4. The reflectometer 110 emits a wideband beam collimated into the through silicon via structure 150' to obtain the reflection spectrum of the through silicon via structure 150'. As shown in FIG. 4, the wideband reflection beam collected by the reflectometer 110 includes the reflection beam 401, the reflection beam 402, and the reflection beam 403. The wideband beam emitting on the silicon surface of the substrate 300' is reflected as the reflection beam 401, which is collected by the reflectometer 110. The wideband beam emitting on the bottom of the through silicon via structure 150' is reflected as the reflection beam 402, which is collected by the reflectometer 110. The wideband beam emitting on the silicon surface of the substrate 300' is reflected twice as the reflection beam 403. If the phase difference of these three reflection beams 401, 402, 403 is an integer multiple of the wavelength of the wideband beam, a constructive interference occurs to enhance the intensity of the reflection beams 401, 402, 403. Generally, the reflection spectrum includes a high-frequency portion and a low-frequency portion, which is the carrier frequency of the high-frequency portion. The low-frequency portion is related to the thickness of the oxide layer. The high-frequency portion is related to the depth of the through silicon via structure 150'. The present disclosure can further separate the low-frequency portion from the high-frequency portion. The high-frequency portion of the reflection spectrum obtained by the reflectometer 110 is shown in FIG. 5. According to the Fresnel equation, such reflection beams, reflected from the oxide layer surface, exhibit a 180 degree phase difference multiplied by a reflection value $$r_{ox}^+ = \frac{n_0 - n_{ox}}{n_{ox} + n_0}$$

wherein $n_0$ represents the refractive index of air, and $n_{ox}$ represents the refractive index of the oxide layer 200' medium. Thus, based on the well-known refractive indexes of air and the oxide layer 200', the reflection value can be calculated as 1.46 when beams are reflected between air and oxide layer 200'. In the embodiment, the thickness of the oxide layer 200 is 0.6 micrometers (μm), and the equivalent optical path difference is 0.9 micrometers (the thickness of the oxide layer 0.6 (μm) multiplied by reflection value 1.46). After Discrete Fourier transformation of the reflection spectrum shown in FIG. 5, the curve shown in FIG. 6, in which reflectance correlates to the depth, is obtained. As shown in FIG. 6, there are three peaks, which show individual peak values, 50 micrometers, 49.1 micrometers (50 (μm) minus the equivalent optical path difference 0.9), and 4.82 micrometers (50 (μm) minus double the equivalent optical path difference). Based on the above-mentioned equivalent optical path difference (0.9 micrometers) and three peak values shown in FIG. 6, it is reasonable that the 50 micrometers means the depth of the through silicon via structure 150'; the 49.1 micrometers means the depth of the through silicon via structure 150' minus the equivalent optical path difference of the reflection beam 401 in the oxide layer 200'; additionally, the 48.2 micrometers means the depth of the through silicon via structure 150' minus twice equivalent optical path difference of the oxide layer 200'. Therefore, the depth of the through silicon via structure 150' is determined to be 50 micrometers, as shown in FIG. 6. Moreover, since the surface of the substrate 300' is very smooth, most of the reflection beam 401 can be collected so as to show the greatest peak value, which means the depth of the through silicon via structure 150' minus the equivalent optical path difference. Such feature can be applied for determining the depth of the through silicon via structure 150'.

In other embodiments (not shown), according to the Fresnel equation, such reflection beams exhibit a 180 degree phase difference multiplied by a reflection value $$r_{si}^+ = \frac{n_0 - n}{n + n_0}$$

wherein $n_0$ represents the refractive index of air, and n represents the refractive index of silicon. Accordingly, different reflection spectrums are generated for through silicon via structures with different depths. The simulation unit (not shown) simulates different reflection spectrums for through silicon via structures with different depths according to the Fresnel equation. The comparing unit (not shown) then selects a simulated reflection spectrum with a minimum difference compared with the collected reflection spectrum and determines the depth of the through silicon via structure 150 (shown in FIG. 1) according to the parameters, i.e. the depth of the selected simulated reflection spectrum.

Alternatively, according to another embodiment of the present disclosure (not shown), the depth of the through silicon via structure is obtained by performing the inverse Fourier transformation of the reflection spectrum of the through silicon via structure.

Figure 7:
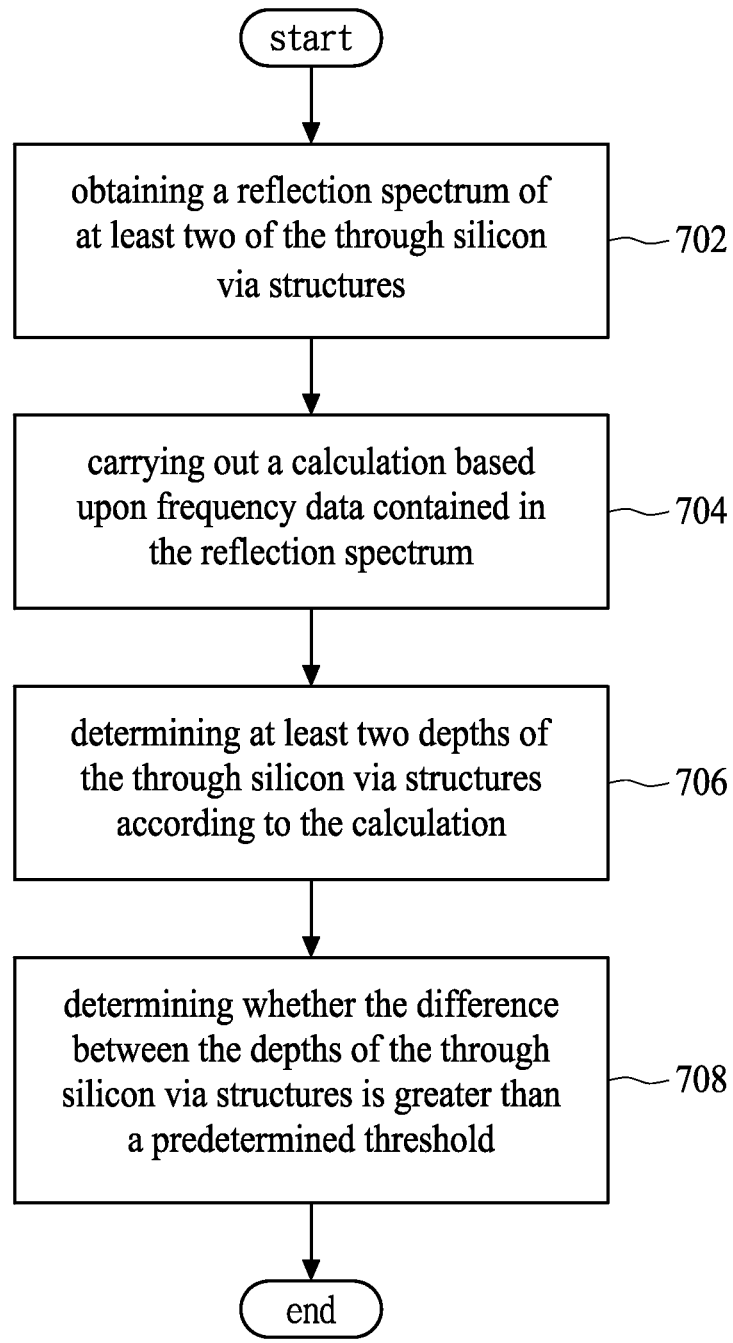
FIG. 7 shows a flow chart illustrating a non-destructive detecting method for measurement of a substrate having high-density through silicon via structure in accordance with another exemplary embodiment of the present disclosure.
Figure 8:
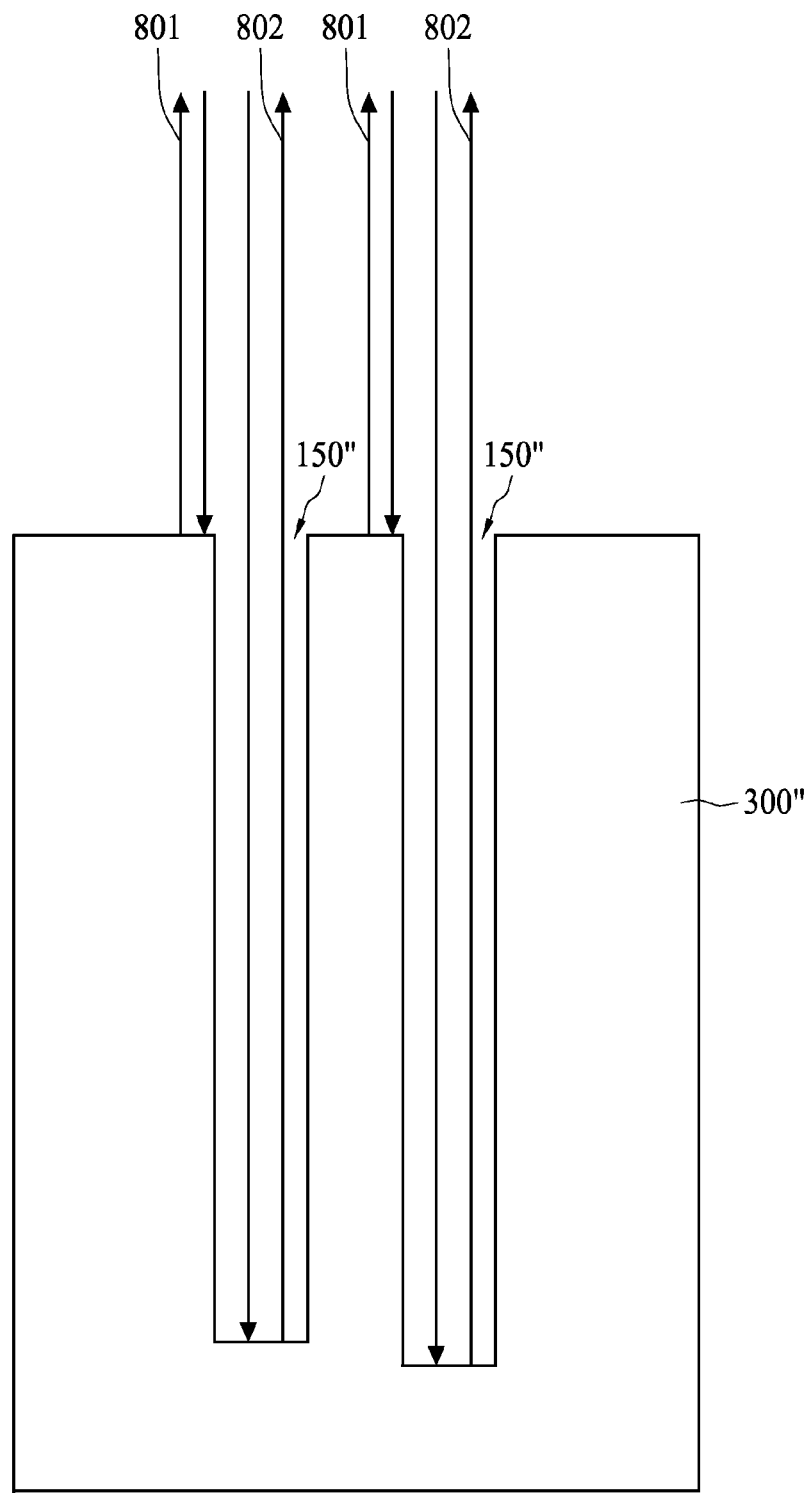
FIG. 8 shows a perspective view of high-density through silicon via structure having high aspect ratios and small apertures in accordance with another exemplary embodiment of the present disclosure.

Another embodiment of the present disclosure is shown in FIG. 7, which illustrates a flow chart of a non-destructive detecting method for measurement of a substrate 300" having high-density through silicon via structure 150" (shown in FIG. 8). The detecting method includes the following steps. Step 702 obtains a reflection spectrum of at least two of the through silicon via structures and step 704 is executed. In step 704, a calculation is carried out based upon frequency data contained in the reflection spectrum and step 706 is executed. In step 706, at least two depths of the through silicon via structures are determined according to the calculation of the reflection spectrum and step 708 is executed. Step 708 determines whether the difference between the depths of the through silicon via structures is greater than a predetermined threshold. If the difference in depths is greater than the predetermined threshold, a substrate containing the through silicon via structures is defective. In the above-mentioned embodiment, the reflection spectrum includes a high-frequency portion and a low-frequency portion. The calculation step 704 is capable of separating or mixing the high-frequency portion and the low-frequency portion. If the high-frequency portion is separated from the low-frequency portion, the high-frequency portion and the low-frequency portion can be calculated separately. In addition, the calculation step 704 also performs Discrete Fourier transformation of the reflection spectrums. The depth determining step 706 determines at least two depths of at least two of the through silicon via structures after Discrete Fourier transformation. The reflection spectrum can be obtained through simultaneously emitting on a plurality of through silicon via structures by the reflectometer. The depth determining step 706 can simultaneously determine the depth of the through silicon via structure for judging whether the substrate is defective.

FIG. 8 shows another substrate 300" having through silicon via structures 150" with high aspect ratio and small aperture. Similarly, the system 100 shown in FIG. 1 and the method shown in FIG. 7 are applied to the through silicon structure 150" shown in FIG. 8. The reflectometer 110 emits a wideband beam collimated into the through silicon via structure 150" to obtain the reflection spectrum of the through silicon via structure 150". As shown in FIG. 8, the wideband reflection beam collected by the reflectometer 110 includes the reflection beam 801 and the reflection beam 802. The wideband beam emitting on the surface of the substrate 300" is reflected as the reflection beam 801, which is collected by the reflectometer 110 (shown in FIG. 2). The wideband beam emitting on the bottom of the through silicon via structure 150" is reflected as the reflection beam 802, which is collected by the reflectometer 110. If the phase difference of the reflection beams 801, 802 is an integer multiple of the wavelength of the wideband beam, a constructive interference occurs to enhance the intensity of the reflection beams 801, 802.

Figure 9:
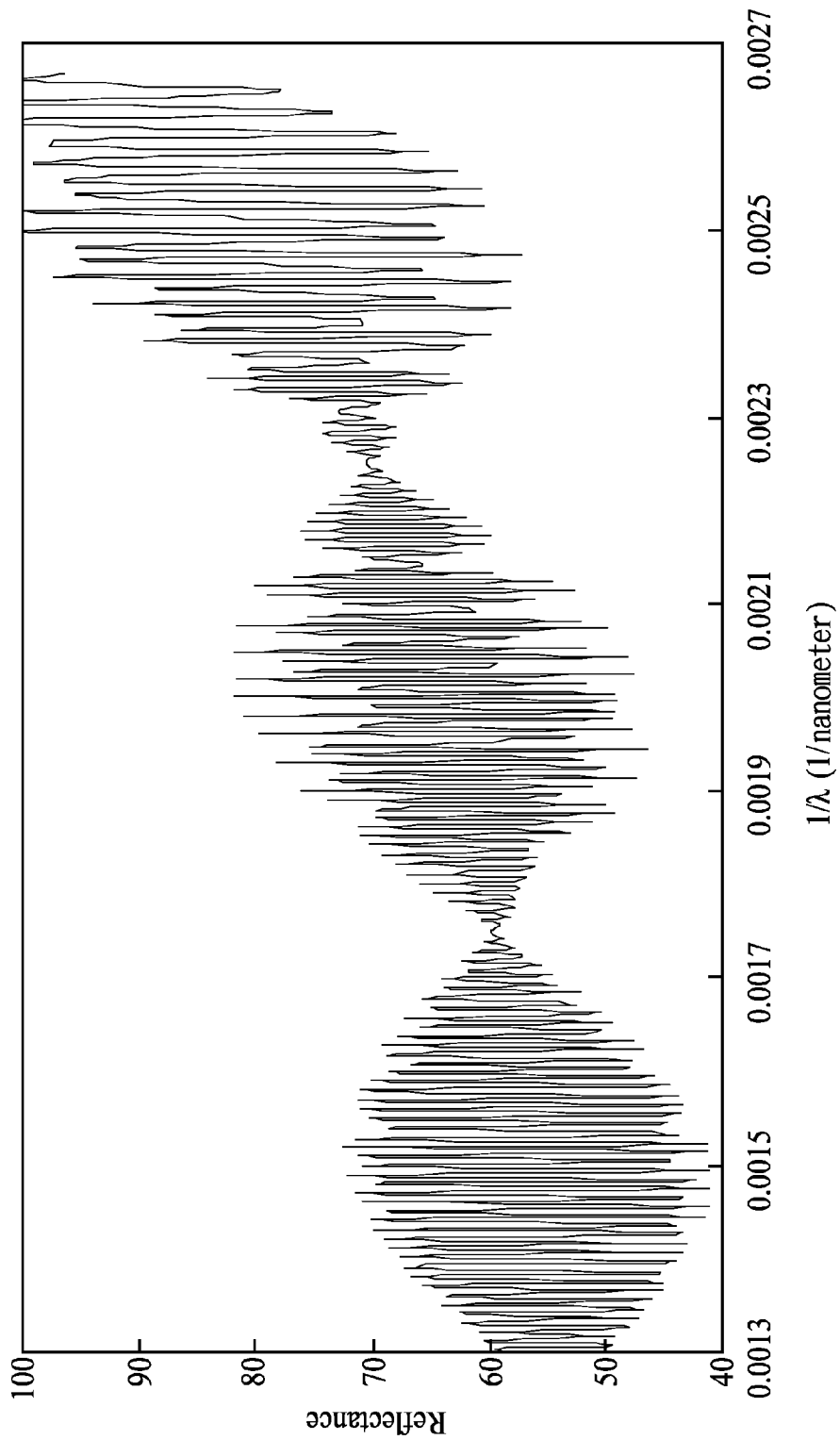
FIG. 9 shows a perspective view illustrating the reflection spectrum shown in FIG. 8.
Figure 10:
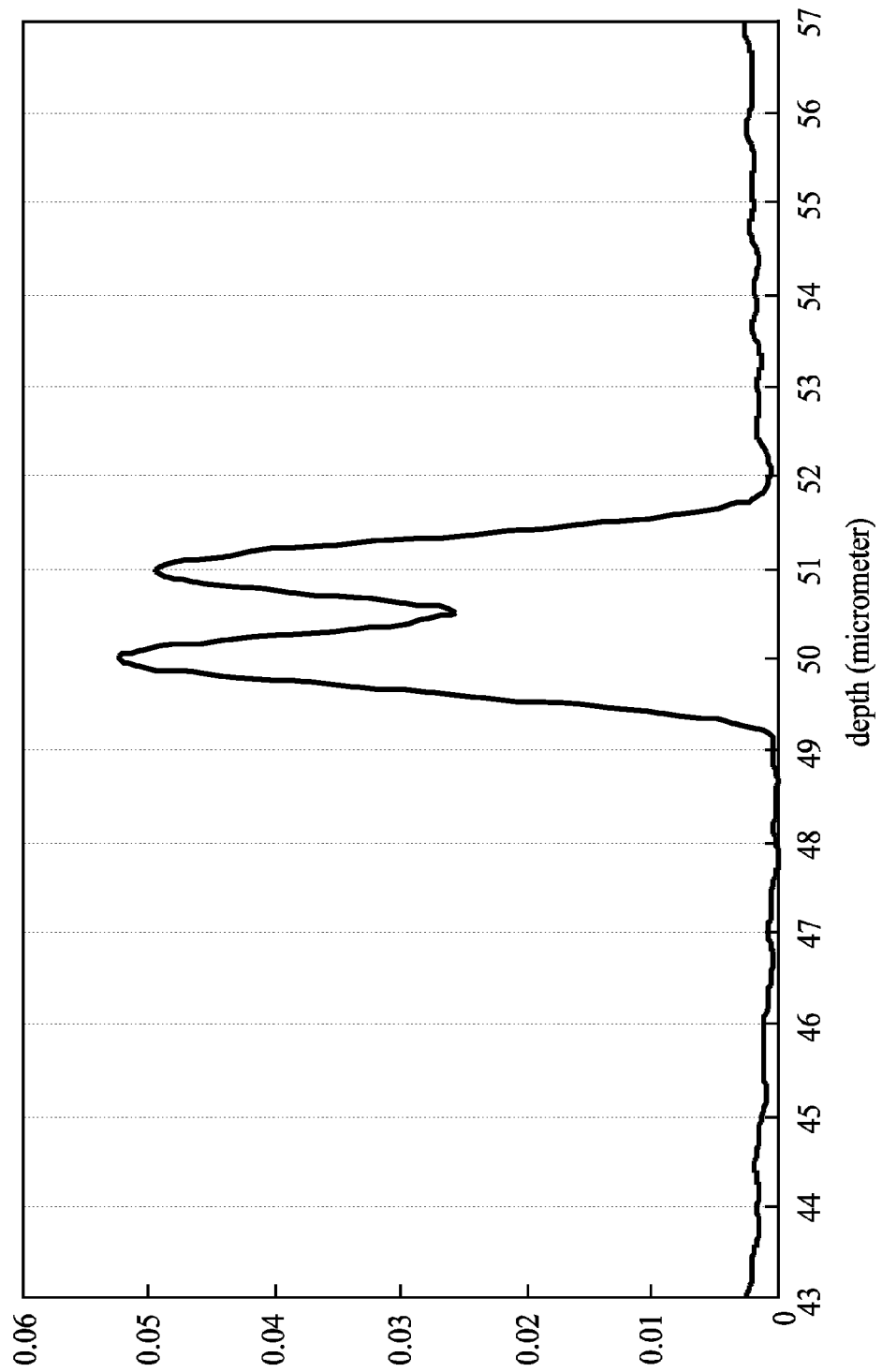
FIG. 10 shows a curve after Discrete Fourier transformation of the reflection spectrum based on FIG. 8.

FIG. 9 shows the reflection spectrum obtained from the through silicon via structure 150" shown in FIG. 8. After Discrete Fourier transformation of the reflection spectrum shown in FIG. 9, the curve shown in FIG. 10, in which reflectance correlates to the depth, is obtained. As shown in FIG. 10, there are two peaks, which show individual peak values, 50 micrometers and 51 micrometers. Since the substrate 300" is not covered by any oxide layer in the embodiment shown in FIG. 8, the equivalent optical path difference can be ignored. In the embodiment, two peak values shown in FIG. 10 represent the depths of the two through silicon via structures 150" shown in FIG. 8. Thus, the reflection spectrum is obtained through simultaneously emitting on a plurality of through silicon via structures 150" and being collected by the reflectometer 110 (shown in FIG. 2) so as to simultaneously determine depths of these through silicon via structures 150".

Figure 11:
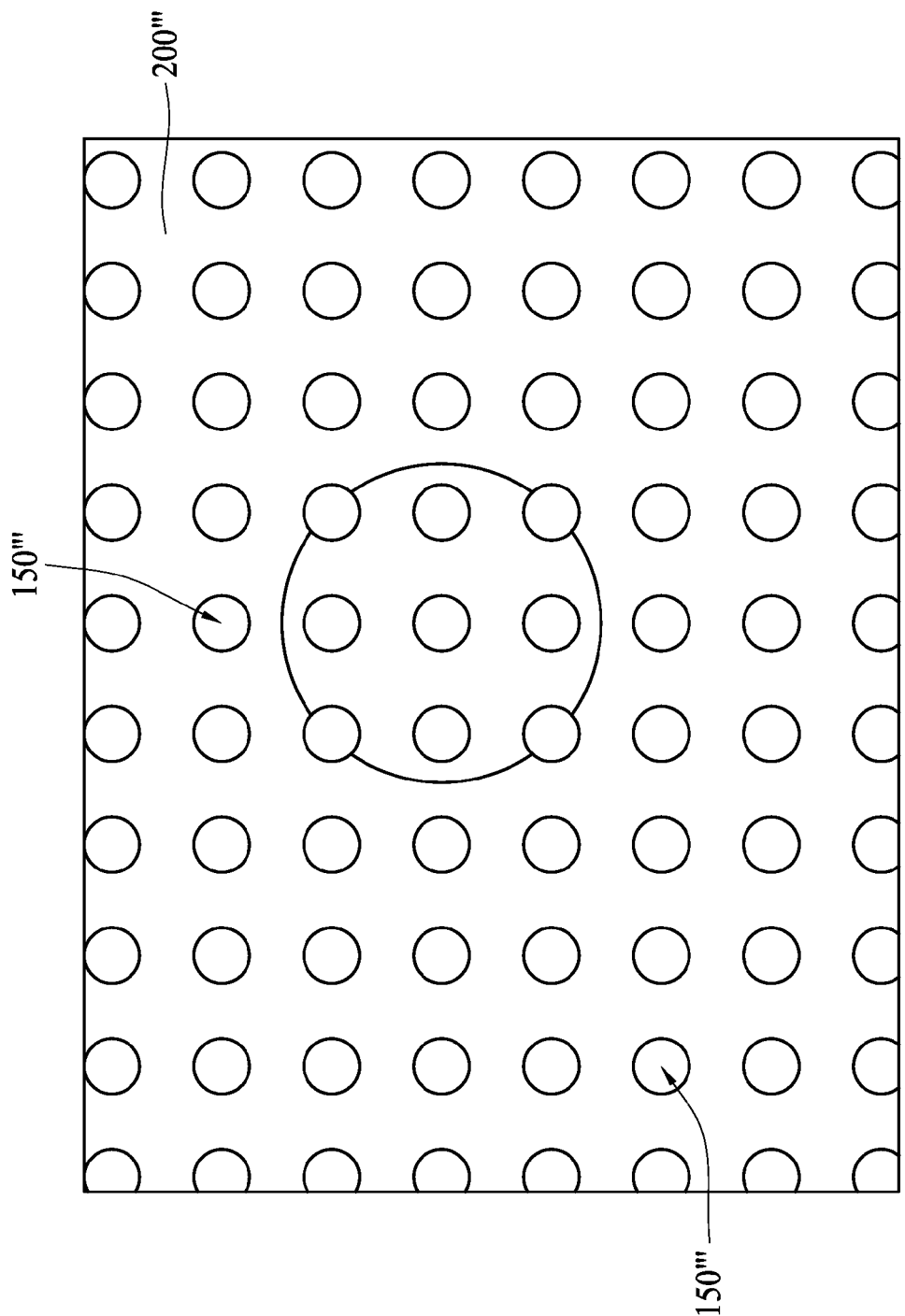
FIG. 11 shows a top view illustrating another substrate having high-density through silicon via structure in accordance with an exemplary embodiment of the present disclosure.
Figure 12:
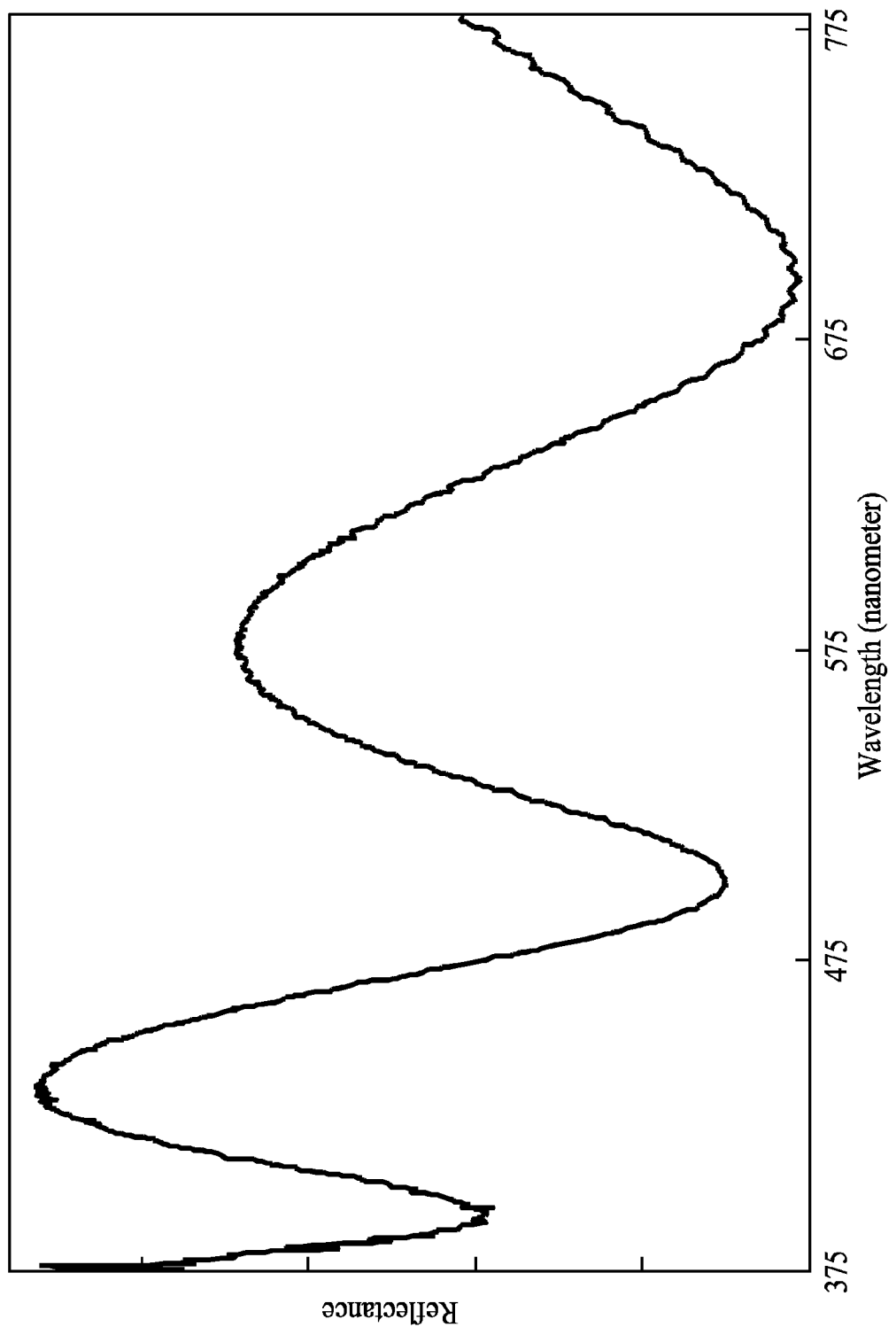
FIG. 12 shows a reflection spectrum in accordance with the exemplary embodiment shown in FIG. 11.
Figure 13:
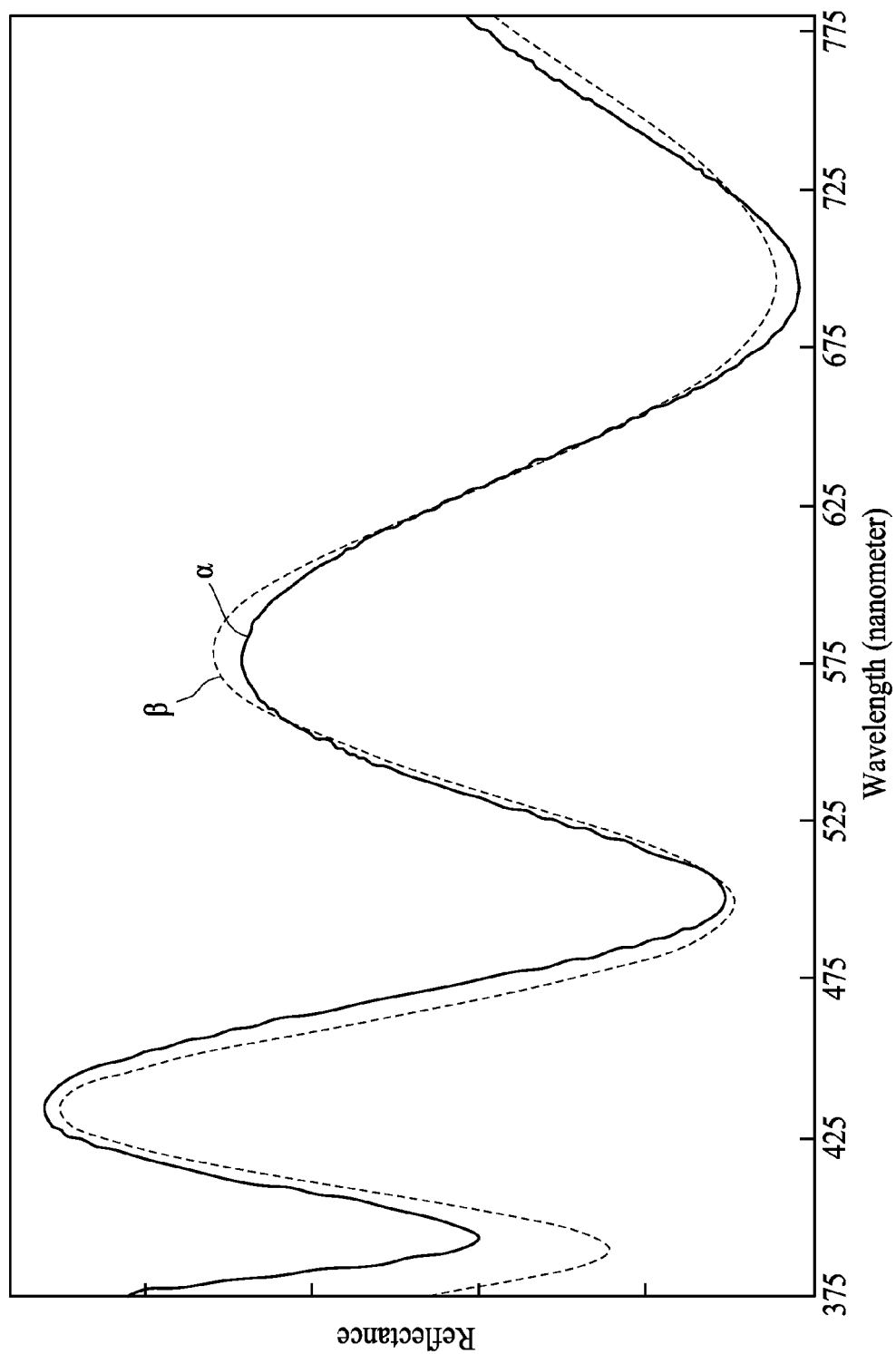
FIG. 13 shows a low-frequency portion of the reflection spectrum in accordance with the exemplary embodiment shown in FIG. 12.
Figure 14:
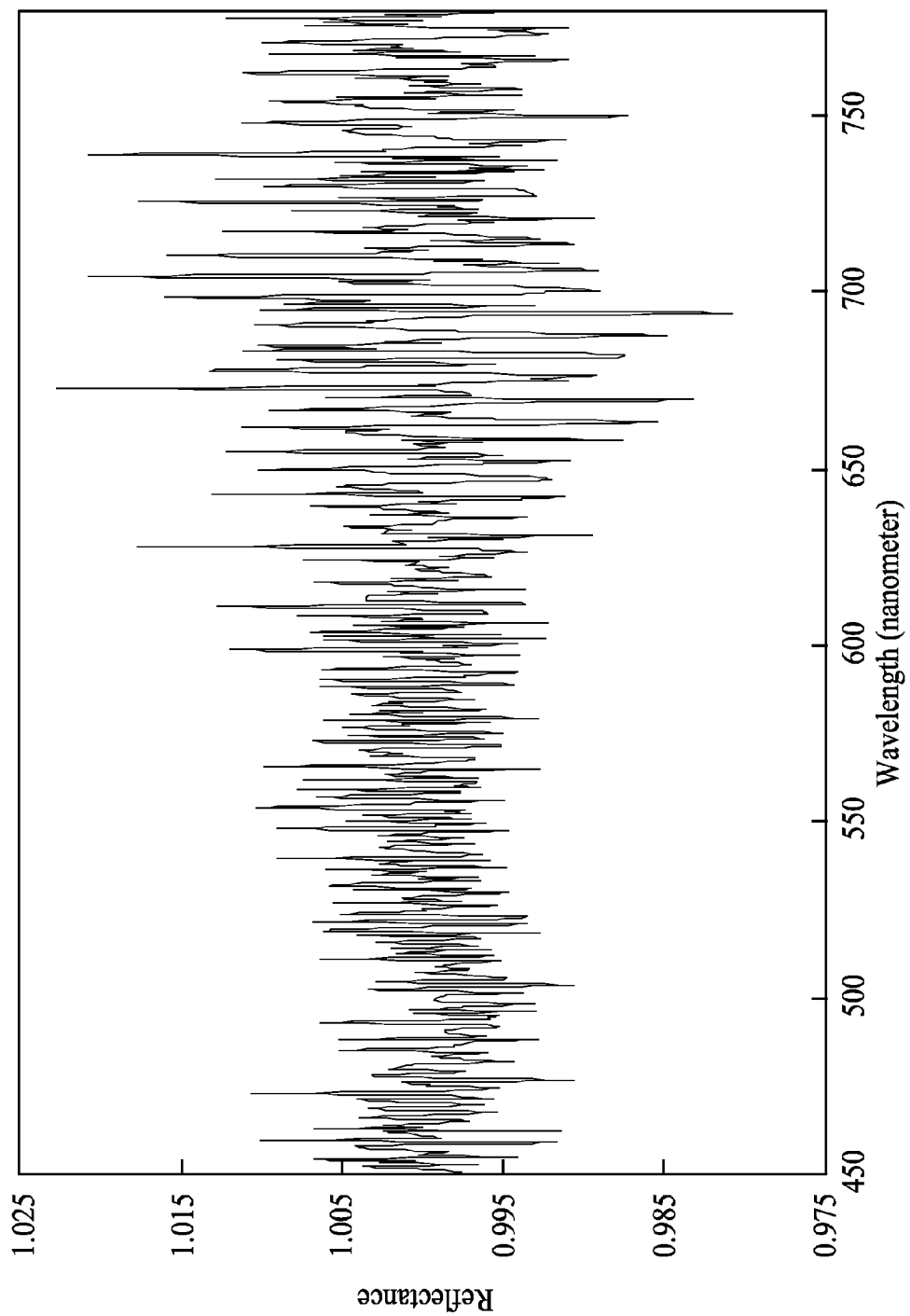
FIG. 14 shows a high-frequency portion of the reflection spectrum in accordance with the exemplary embodiment shown in FIG. 12.
Figure 15:
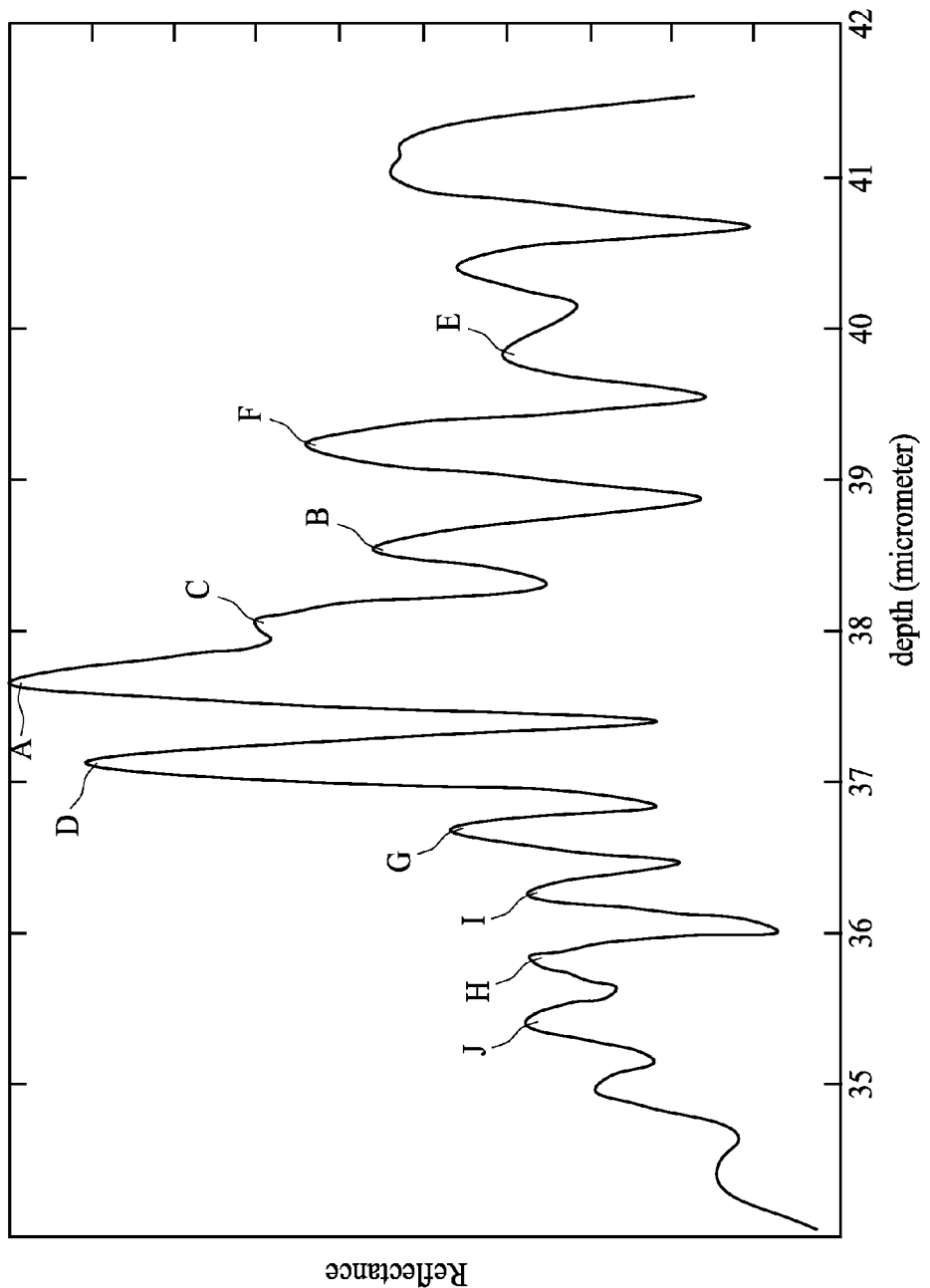
FIG. 15 shows a curve after Discrete Fourier transformation of a high-frequency portion of the reflection spectrum shown in FIG. 14.

FIG. 11 shows a top view of another substrate (not shown) having high-density through silicon via structures 150'''. The substrate is covered by an oxide layer 200'''. Since the light spot 400 of the wideband beam from the reflectometer projects on at least five through silicon via structures 150''', the present disclosure can perform simultaneous depth measurement for a plurality of through silicon via structures 150'''. The measured reflection spectrum, as shown in FIG. 12, includes a low-frequency portion and a high-frequency portion. The low-frequency portion is the carrier frequency of the high-frequency portion. The low-frequency portion is related to the thickness of the oxide layer 200'''. The high-frequency portion is related to the depth of the through silicon via structure 150'''. The low-frequency portion and the high-frequency portion can be separated or not for further processing. If the low-frequency portion and the high-frequency portion are separated, FIG. 13 shows the low-frequency portion a of the reflection spectrum in FIG. 12 and FIG. 14 shows the high-frequency portion of the reflection spectrum in FIG. 12. As shown in FIG. 13, the above-mentioned simulation unit (not shown) simulates different reflection spectrums β for through silicon via structures with different depths. The comparing unit (not shown) then selects a simulated reflection spectrum with a minimum difference compared with the collected reflection spectrum from the reflectometer 110 and determines the thickness of the oxide layer 200''' according to the parameters, i.e. the depth of the selected simulated reflection spectrum. Since the thickness of the oxide layer 200''' is 0.596 micrometers in the embodiment, the equivalent optical path difference is 0.87 micrometers (the thickness of the oxide layer 0.596 (μm) multiplied by the reflection value 1.46). After Discrete Fourier transformation of the high-frequency portion of the reflection spectrum shown in FIG. 14, the curve shown in FIG. 15, in which reflectance correlates to the depth, is obtained. FIG. 15 shows a plurality of peaks. The difference between the depths of the peak A and the peak B is 0.87 micrometers. In addition, the differences between the depths of the peak C and the peak D, between the depths of the peak E and the peak F, between the depths of the peak G and the peak H, and between the depths of the peak I and the peak J are 0.87 micrometers. Thus, the depths of the five through silicon via structures 150''' can be determined as 38.55 micrometers, 38 micrometers, 36.7 micrometers, 36.27 micrometers, and 39.86 micrometers. If the predetermined defective threshold of the depth difference is set at 1 micrometer, the substrate having a depth difference among the above-mentioned through silicon via structures greater than the predetermined defective threshold is determined to be defective. Therefore, the present disclosure can quickly determine, in a nondestructive way, whether the above-identified substrate is defective or not.

The present disclosure provides a computer readable medium (not shown) for storing an application program (not shown). The application program allows a system 100 (shown in FIG. 1) for measurement of a through silicon via structure to perform a detecting method (shown in FIG. 7), which comprises the following steps. Step 702 obtains a reflection spectrum of at least two of the through silicon via structures and step 704 is executed. In step 704, a calculation is carried out based upon frequency data contained in the reflection spectrum and step 706 is executed. In step 706, at least two depths of the through silicon via structures are determined according to the calculation and step 708 is executed. Step 708 determines whether the difference between the depths of the through silicon via structures is greater than a predetermined threshold. If the difference in depths is greater than the predetermined threshold, a substrate containing the through silicon via structures is determined to be defective. In the above-mentioned embodiment, the reflection spectrum includes a high-frequency portion and a low-frequency portion. The calculation step 704 can mix the high-frequency portion and the low-frequency portion. In addition, the calculation step 704 can perform Discrete Fourier transformation of the reflection spectrum. The depth determining step 706 can determine the depth of the through silicon via structure after Discrete Fourier transformation of the reflection spectrum. The reflection spectrum can be obtained through emitting to a plurality of through silicon via structures and then collected by the reflectometer. The depth determining step 706 can simultaneously determine the depth of the through silicon via structures for determining whether the substrate is defective or not.

In conclusion, the exemplary embodiments of the systems, methods, and computer readable mediums for determining through silicon via structure parameters provided by this disclosure can measure the depth and the bottom profile of a through silicon via structure in a fast and non-destructive way, and therefore are more suitable for through silicon via structure measurement.

The above-described exemplary embodiments are intended to be illustrative only. Those skilled in the art may devise numerous alternative embodiments without departing from the scope of the following claims.

We claim:

1. A method for measurement of through silicon via structure, the method comprising:
    obtaining a reflection spectrum of at least one through silicon via structure, wherein the reflection spectrum includes a high-frequency portion and a low-frequency portion, and the low-frequency portion serves as a carrier frequency of the high-frequency portion;
    carrying out a calculation based upon a magnitude of the high-frequency portion contained in the reflection spectrum; and
    determining a depth of the at least one through silicon via structure according to the calculation.

2. The method of claim 1, wherein the calculation further includes calculating a magnitude of the low-frequency portion of the reflection spectrum, and the step of depth determining includes determining a thickness of an oxide layer according to the calculation based upon the magnitude of the low-frequency portion of the reflection spectrum.

3. The method of claim 1, wherein the calculation further includes separating the high-frequency portion from the low-frequency portion so as to calculate the high-frequency portion and the low-frequency portion separately.

4. The method of claim 1, wherein the calculation further includes performing a Discrete Fourier transformation of the reflection spectrum, and the step of depth determining further includes determining the depth of the at least one through silicon via structure according to the calculation after the Discrete Fourier transformation of the reflection spectrum.

5. The method of claim 1, wherein the reflection spectrum is obtained by operating a reflectometer emitting on the at least one through silicon via structure.

6. The method of claim 5, wherein the reflection spectrum is obtained by operating the reflectometer emitting on a plurality of through silicon via structures simultaneously, and depths of the through silicon via structures are determined simultaneously by the step of depth determining.

7. A method for measurement of through silicon via structure, the method comprising:
obtaining a reflection spectrum of at least two through silicon via structures, wherein the reflection spectrum includes a high-frequency portion and a low-frequency portion, and the low-frequency portion serves as a carrier frequency of the high-frequency portion;
carrying out a calculation based upon a magnitude of the high-frequency portion contained in the reflection spectrum;
determining at least two depths of the through silicon via structures according to the calculation; and
determining whether the difference between the depths of the through silicon via structures is greater than a predetermined threshold, and if the difference between the depths is greater than the predetermined threshold, a substrate containing the through silicon via structures is defective.

8. The method of claim 7, wherein the calculation further includes separating the high-frequency portion from the low-frequency portion so as to calculate the high-frequency portion and the low-frequency portion separately.

9. The method of claim 7, wherein the calculation further includes performing a Discrete Fourier transformation of the reflection spectrum, and the step of depth determining further includes determining the depths of the at least two through silicon via structures according to the calculation after the Discrete Fourier transformation of the reflection spectrum.

10. The method of claim 7, wherein the reflection spectrum is obtained by operating a reflectometer emitting on at least two of the through silicon via structures.

11. The method of claim 10, wherein the reflection spectrum is obtained by operating the reflectometer emitting on a plurality of the through silicon via structures simultaneously, and depths of the through silicon via structures are simultaneously determined by the step of depth determining.

12. A computer readable medium for storing an application program, wherein the application program allows a system for measurement of through silicon via structure to perform a detecting method, the detecting method comprising:
obtaining a reflection spectrum of at least two of the through silicon via structures, wherein the reflection spectrum includes a high-frequency portion and a low-frequency portion, and the low-frequency portion serves as a carrier frequency of the high-frequency portion;
carrying out a calculation based upon a magnitude of the high-frequency portion contained in the reflection spectrum,
determining at least two depths of the through silicon via structures according to the calculation; and
determining whether the difference between the depths of both of the through silicon via structures is greater than a predetermined threshold, and if the difference in depths is greater than the predetermined threshold, a substrate containing the through silicon via structures is defective.

13. The computer readable medium of claim 12, wherein the calculation further includes calculating the magnitude of the low-frequency portion of the reflection spectrum, and the step of depth determining includes determining a thickness of an oxide layer according to the calculation based upon the magnitude of the low-frequency portion of the reflection spectrum.

14. The computer readable medium of claim 12, wherein the calculation further includes separating the high-frequency portion from the low-frequency portion so as to calculate the high-frequency portion and the low-frequency portion separately.

15. The computer readable medium of claim 12, wherein the calculation further includes performing a Discrete Fourier transformation of the reflection spectrum, and the step of depth determining further includes determining the depths of at least two of the through silicon via structures according to the calculation after the Discrete Fourier transformation of the reflection spectrum.

16. The computer readable medium of claim 12, wherein the reflection spectrum is obtained by operating a reflectometer emitting on at least two of the through silicon via structures.

17. The computer readable medium of claim 15, wherein the reflection spectrum is obtained by operating the reflectometer emitting on a plurality of the through silicon via structures simultaneously, and depths of the through silicon via structures are simultaneously determined by the step of depth determining.

* * * * *